US012719498B1

(12) United States Patent
Hansen

(10) Patent No.: US 12,719,498 B1
(45) Date of Patent: Aug. 25, 2026

(54) TRANSFORMATION OF EMBEDDING MATRICES FOR COMPRESSION, STORAGE, AND REUSE

(71) Applicant: Dropbox, Inc., San Francisco, CA (US)

(72) Inventor: Jacob Gorm Hansen, Ryomgård (DK)

(73) Assignee: Dropbox, Inc., San Francisco, CA (US)

( * ) Notice: Subject to any disclaimer, the term of this patent is extended or adjusted under 35 U.S.C. 154(b) by 0 days.

(21) Appl. No.: 19/546,810

(22) Filed: Feb. 23, 2026

(51) Int. Cl.
*H03M 7/30* (2006.01)
*G06N 3/084* (2023.01)

(52) U.S. Cl.
CPC ....... *H03M 7/3082* (2013.01); *H03M 7/3077* (2013.01); *H03M 7/6005* (2013.01); *H03M 7/6011* (2013.01); *G06N 3/084* (2013.01)

(58) Field of Classification Search
CPC ............. H03M 7/3082; H03M 7/3077; H03M 7/6055; H03M 7/6011; G06N 3/084
See application file for complete search history.

(56) References Cited

U.S. PATENT DOCUMENTS

2021/0056428 A1* 2/2021 Palowitch .............. G06F 17/10

* cited by examiner

*Primary Examiner* — Joseph J Lauture
(74) *Attorney, Agent, or Firm* — Keller Preece PLLC

(57) ABSTRACT

The present disclosure relates to systems, non-transitory computer-readable media, and methods for preparing embedding matrices for compression, storage, and reuse. For example, the disclosed systems can receive or generate an embedding matrix comprising a plurality of embedding vectors representing a text content item, the plurality of embedding vectors exhibiting locality in a first dimension of the embedding matrix. The disclosed systems can apply a decorrelating transform along the first dimension of the embedding matrix to generate a transformed embedding matrix by compacting energy distributed across the embedding matrix in the first dimension into a sub-portion of the transformed embedding matrix. Further, the disclosed systems can compress the transformed embedding matrix by performing a compression operation to generate a compressed embedding matrix, and can store the compressed embedding matrix for the text content item.

20 Claims, 8 Drawing Sheets

Pre-Compression Processing 108
First-Dimension Processing 108a
Decorrelation 110a
Second-Dimension Processing 108b
Locality Induction 112
Decorrelation 110b
Embedding Matrix 106
V1 V2 . . . Vn
Compression Operation 114
Embedding Model 104
Compressed Embedding Matrix 116
Auxiliary Information 118
Content Item 102
Storage 120

600
Client Device 610
Client Application 612
Embedding Compression System 100
Third Party Server(s) 616
Embedding Model 606
Network 614
Server Device(s) 602
Content Management System 604
Embedding Compression System 100
Embedding Model 606
Compressed Embedding Matrices 608

TRANSFORMATION OF EMBEDDING MATRICES FOR COMPRESSION, STORAGE, AND REUSE

BACKGROUND

Recent advances in machine learning and data processing technologies have led to widespread use of vector embeddings to represent documents, files, signals, and other content items in numerical form. Such embeddings are generated by embedding models that encode semantic, contextual, or structural properties of content into high-dimensional vectors, enabling downstream tasks such as search and ranking, content analysis, classification, clustering, recommendation, and media processing (e.g., image editing). By way of example, information retrieval systems and content management systems commonly employ embeddings to support search, ranking, and analytics. In many systems, a single content item is represented by multiple embedding vectors, which together form an embedding matrix associated with the content item.

Embedding matrices generated for content items are often used beyond initial ingestion and may be required during later system operations. For example, information retrieval systems often require access to embeddings when updating or maintaining a search index, responding to queries, or performing periodic reprocessing tasks. Regenerating embeddings during such operations can be computationally expensive and time-consuming, particularly when embedding models are complex, resource-intensive, or externally hosted. As a result, some systems persist previously generated embedding matrices to avoid repeated recomputation.

While persisting embedding matrices can reduce repeated embedding generation, it introduces additional technical challenges. Embedding matrices are often high-dimensional and numerically dense, and storing them at scale can consume significant storage resources. Systems that persist embedding matrices may therefore encounter constraints related to storage capacity, memory usage, and data transfer overhead, particularly in distributed or cloud-based environments where large collections of content items are maintained.

To address storage constraints, existing solutions often attempt to compress embedding matrices prior to storage. Many such approaches rely on conventional quantization or fixed-precision representations to reduce data size. However, these techniques often limit flexibility in how compression parameters are selected and can introduce loss of fidelity that affects downstream use of the embeddings. At the same time, as content collections grow and embedding matrices become larger or more numerous, existing systems frequently encounter increased storage overhead, data transfer costs, and operational complexity during system updates and maintenance. These challenges can make it difficult for existing systems to persist and reuse embedding matrices in a manner that balances storage requirements, compression accuracy, and downstream usability.

These, along with additional problems and issues, exist with regard to storing, compressing, and reusing embedding matrices in embedding-based computing systems, including information retrieval systems and content management systems.

SUMMARY

Embodiments of the present disclosure provide benefits and/or solve one or more of the foregoing or other problems in the art with systems, non-transitory computer readable media, and methods for compressing embedding matrices for storage and reuse. In some embodiments, the disclosed systems receive or generate an embedding matrix comprising a plurality of embedding vectors representing a content item and apply a decorrelating transform along a first dimension of the embedding matrix that is expected to exhibit locality among values of the embedding matrix. By compacting energy distributed across the embedding matrix in the first dimension into a sub-portion of a transformed embedding matrix, the disclosed systems produce representations that are more amenable to compression. The disclosed systems can then apply a compression operation to the transformed embedding matrix to generate a compressed embedding matrix for the content item and store the compressed embedding matrix for subsequent use.

In some embodiments, the disclosed systems further improve compressibility by inducing locality along a second dimension of the embedding matrix. For example, portions of the embedding matrix may be reordered based on values of the embedding matrix to increase locality along the second dimension, after which a second decorrelating transform is applied along that dimension. Auxiliary information representing the reordering may be stored to support subsequent restoration of an original ordering of the embedding matrix. These techniques enable additional energy compaction across multiple dimensions of the embedding matrix prior to compression.

Additional features and advantages of one or more embodiments of the present disclosure are described below and, in part, will be apparent from the description or may be learned through practice of the disclosed embodiments.

BRIEF DESCRIPTION OF THE DRAWINGS

The detailed description provides one or more embodiments with additional specificity and detail through the use of the accompanying drawings, as briefly described below.

DETAILED DESCRIPTION

This disclosure describes one or more embodiments of an embedding compression system 100 that compresses embedding matrices for storage and reuse within embedding-based computing environments. In various embodiments, the embedding compression system 100 can receive or generate embedding matrices comprising multiple embedding vectors that represent a content item and prepare those embedding matrices for compression using one or more transform-based processing techniques. In certain embodiments, the embedding compression system 100 applies one or more decorrelating transforms along one or more dimensions of an embedding matrix to compact signal energy and produce transformed representations that are more amenable to compression, and in some embodiments, the embedding compression system 100 further reorders portions of an embedding matrix to induce locality along an additional dimension prior to applying a decorrelating transform along that dimension.

In some embodiments, the embedding compression system 100 further supports configurable compression of transformed embedding matrices and subsequent reconstruction of embedding matrices for downstream use, such as during system updates, retrieval operations, or other embedding-driven workflows. For example, when a content item is modified or reprocessed, the embedding compression system 100 can enable a search index or similar data structure to be updated using previously stored compressed embedding matrices, avoiding repeated regeneration of embeddings from the content item. The embedding compression system 100 may operate within a variety of computing systems, including content management systems, information retrieval systems, and other environments that utilize embedding matrices as internal data representations.

Figure 1:
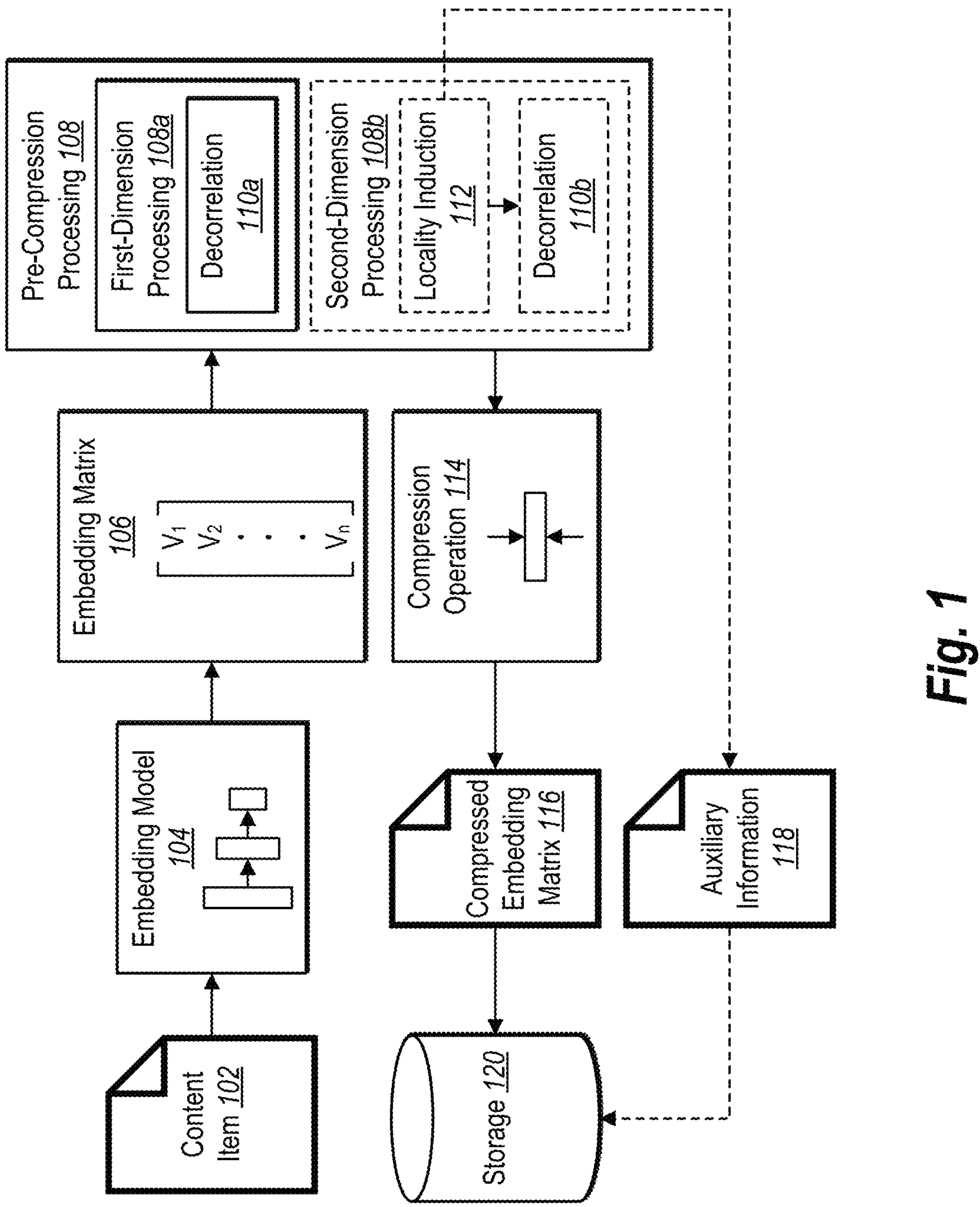
FIG. 1 illustrates an example overview of an embedding compression system processing and compressing an embedding matrix for a content item in accordance with one or more embodiments.

FIG. 1 provides an example overview of the embedding compression system 100 preparing an embedding matrix for compression, compressing the prepared embedding matrix, and storing the compressed embedding matrix in accordance with one or more embodiments. Additional detail regarding the acts and processes introduced in relation to FIG. 1 is provided thereafter with reference to subsequent figures.

As shown in FIG. 1, the embedding compression system 100 receives, identifies, or otherwise obtains a content item 102. The content item 102 may include, for example, a document, file, message, record, image, video, or other unit of digital content. In some embodiments, the content item 102 comprises a text content item, such as a document or collection of text, while in other embodiments the content item 102 may comprise another form of content for which embedding-based representations are generated.

As also shown in FIG. 1, the embedding compression system 100 provides the content item 102 to an embedding model 104. As used herein, the term "embedding model" refers to a model, algorithm, process, or combination of processes configured to generate numerical vector representations of content items. In various embodiments, the embedding model 104 may include a machine-learning-based encoder, such as a neural network or transformer-based model, that maps the content item 102 (or portions thereof) into one or more embedding vectors that capture semantic, contextual, or structural properties of the content. The embedding model 104 may operate on an entire content item or on segments, tokens, windows, or other subdivisions of the content item.

As illustrated, the embedding compression system 100 utilizes the embedding model 104 to generate an embedding matrix 106 comprising a plurality of embedding vectors representing the content item 102. In some embodiments, rather than generating the embedding matrix 106 locally, the embedding compression system 100 may identify a previously generated embedding matrix associated with the content item 102 or receive an embedding matrix from an external system or service. As used herein, an "embedding matrix" refers to a numerical data structure that includes multiple embedding vectors arranged along one or more dimensions, such as rows or columns of a matrix. For example, an embedding matrix 106 may include a respective embedding vector for each token, segment, or window of a content item. Moreover, in some embodiments, embedding vectors are arranged as rows of the embedding matrix (e.g., horizontally), while individual components of each embedding vector extend along columns (e.g., vertically), although other arrangements may be used.

In some embodiments, an embedding matrix includes embedding vectors generated from visual or multimodal encoders. For example, the embedding compression system 100 may obtain a content item that includes a document rendered as an image (or a set of image tiles) and provide the image representation to a vision encoder (e.g., a vision-language model) or multimodal encoder that generates a set of latent visual token vectors (e.g., patch-level or tile-level token embeddings). The embedding compression system 100 may treat such latent visual token vectors as embedding vectors and arrange them as an embedding matrix (e.g., as a sequence of token vectors or as a flattened grid of token vectors) for pre-compression processing and compression as described herein.

As further illustrated in FIG. 1, the embedding compression system 100 provides the embedding matrix 106 to pre-compression processing 108. In particular, the pre-compression processing 108 prepares the embedding matrix 106 for compression by applying one or more processing operations that modify the numerical structure of the matrix while preserving the underlying information represented by the embedding vectors. In the illustrated embodiment, the pre-compression processing 108 includes first-dimension processing **108*a* and, optionally, second-dimension processing 108*b***.

As shown in FIG. 1, the first-dimension processing **108*a* comprises a decorrelation operation 110*a* applied along a first dimension of the embedding matrix 106**. As used herein, the term "decorrelation" refers to a processing operation that reduces correlation or redundancy among values of the embedding matrix along a selected dimension, thereby producing a transformed representation in which signal energy is more concentrated. In various embodiments, decorrelation may be performed using a decorrelating transform, such as a discrete wavelet transform (e.g., Haar, Daubechies, Coiflet, Symlet, or other wavelet families), a Walsh-Hadamard transform (sometimes referred to as a Hadamard transform), a discrete cosine transform, a principal-component-type transform, or another linear or approximately orthogonal transform suitable for reducing correlation among values along the dimension. In some embodiments, the first dimension corresponds to an ordering of embedding vectors associated with tokens, segments, or other ordered portions of the content item. In one or more embodiments, the first dimension corresponds to a vertical dimension of the embedding matrix (e.g., an ordering of rows corresponding to tokens, segments, or windows of a content item).

In some embodiments, the pre-compression processing 108 further includes second-dimension processing **108*b*. The second-dimension processing 108*b* may comprise an operation for locality induction 112 followed by a decorrelation operation 110*b* applied along a second dimension of the embedding matrix 106. As used herein, "locality induction" refers to a processing operation that increases similarity or correlation among neighboring values along a dimension of the embedding matrix. In one or more embodiments, the second dimension corresponds to a horizontal dimension of the embedding matrix (e.g., across components of the embedding vectors). In some embodiments, for example, the locality induction 112 is performed by reordering portions of the embedding matrix based on values of the embedding matrix, such as by grouping or sorting rows, columns, or other portions of the matrix (e.g., according to aggregate values of the embedding matrix). After locality is induced along the second dimension, a decorrelating transform may be applied along that dimension to further compact signal energy. Additional details regarding decorrelation and locality induction are described below with reference to FIG. 2**.

Following the pre-compression processing 108, the embedding compression system 100 applies a compression operation 114 to the processed embedding matrix. As used herein, a "compression operation" refers to one or more operations that reduce the size of a numerical representation for storage or transmission. In various embodiments, the compression operation 114 may include, without limitation, quantization of values of the processed embedding matrix, conversion to a fixed-point representation, entropy encoding, coefficient selection or truncation, region-based compression, or combinations thereof. As a result of the compression operation 114, the embedding compression system 100 generates a compressed embedding matrix 116 corresponding to the content item 102. The compressed embedding matrix 116 represents the embedding matrix 106 in a reduced-size form suitable for storage and later use.

As further shown in FIG. 1, the compressed embedding matrix 116 is stored in storage 120. The storage 120 may include, for example, non-volatile storage such as persistent memory, disk storage, solid-state storage, or cloud-based object storage. In some embodiments, the compressed embedding matrix 116 is stored for reuse during subsequent system operations, such as index maintenance, updates, or other embedding-driven workflows. In addition to storing the compressed embedding matrix 116, in some embodiments, the embedding compression system 100 generates and stores auxiliary information 118 in relation to the locality induction 112. The auxiliary information 118 may include, for example, a permutation vector or other form of permutation information (e.g., identifying a reordered index position for each row, column, or other portion of the embedding matrix), offset information, or index tables that represent how portions of the embedding matrix were reordered during the locality induction 112 or otherwise during the pre-compression processing 108. In some embodiments, for example, "offset information" includes values indicating, for respective reordered portions (e.g., rows, columns, blocks, tiles, or other segments), an original position of a portion relative to a new position (or vice versa), such as by indicating a displacement, shift amount, start index, or mapping between indices. As illustrated, the auxiliary information 118 may be stored with, or in association with, the compressed embedding matrix 116 and may be used to support subsequent restoration of an original ordering of the embedding matrix 106 during reconstruction.

As mentioned, the embedding compression system 100 provides a number of advantages over existing systems that store and reuse embedding matrices in embedding-based computing environments. In particular, the embedding compression system 100 improves how embedding matrices are prepared for compression by applying a decorrelating transform along a dimension expected to exhibit locality among values of the embedding matrix. By transforming the embedding matrix prior to compression, the embedding compression system 100 produces a transformed embedding matrix in which signal energy is concentrated into a sub-portion of the matrix, resulting in representations that are more amenable to compression while preserving the underlying numerical structure of the embeddings. In some embodiments, the embedding compression system 100 selects the dimension for applying a decorrelating transform based on an expected locality among embedding values arising from how embedding vectors are generated or arranged (e.g., according to an ordering of tokens or token groups), which increases the effectiveness of applying decorrelating transforms in preparation for compression of embedding matrices. This advantage is particularly relevant in late-interaction information retrieval systems, where a single document may be represented by an embedding vector for each token offset, making recomputation costly during index updates and motivating persistent storage of embedding matrices.

In some embodiments, the embedding compression system 100 further improves compression fidelity and configurability relative to existing approaches that rely on fixed-precision or uniform quantization schemes. By compacting energy into a sub-portion of the transformed embedding matrix, for example, the embedding compression system 100 enables differentiated treatment of portions of the matrix during compression. In one or more embodiments, the embedding compression system 100 identifies regions associated with higher dynamic range and lower dynamic range and applies different compression settings to those regions. This approach allows the system to reduce storage requirements while maintaining accuracy of embedding values used in downstream operations. By way of example, in an information retrieval system employing 128-dimensional document embeddings, simple quantization from 32-bit floating point to 8-bit fixed-point precision can retain approximately 99.99% retrieval accuracy while achieving a 4× reduction in storage size, and quantization to 4-bit fixed-point precision can retain greater than 98% accuracy. The embedding compression system 100 builds on this observation by first performing transform-based energy compaction, enabling more aggressive compression—such as effective bit rates below 4 bits per vector component—while maintaining substantially higher accuracy than naïve low-bit quantization alone.

In addition, the embedding compression system 100 improves control over compression behavior by enabling selection of compression parameters based on characteristics of the embedding matrix or the associated content item. By selecting a target compression ratio or bit budget as an explicit compression objective and adjusting one or more parameters of a compression operation accordingly (e.g., as described below in relation to FIG. 3), the embedding compression system 100 supports fine-grained rate control for embedding matrices, including non-integer average numbers of bits per vector component. For example, after transform-based energy compaction separates HDR and LDR components (e.g., as described below in relation to FIGS. 2 and 3), the embedding compression system 100 may apply distinct quantization step sizes to different portions of the transformed embedding matrix, or may treat the transformed matrix as a single HDR signal and rely on entropy encoding to achieve high compression efficiency. In practice, such configurations can yield compressed representations with effective sizes comparable to or smaller than naïve 3-bit quantization, while maintaining greater than 99% worst-case accuracy, whereas conventional 3-bit quantization may degrade accuracy to approximately 92-95%. This capability allows the system to adapt compression behavior across content items and operational contexts without modifying the underlying embedding generation process.

In some embodiments, the embedding compression system 100 also improves compressibility of embedding matrices that do not naturally exhibit locality along all dimensions. By reordering portions of the embedding matrix based on values of the embedding matrix to induce locality along a target dimension, and applying a decorrelating transform along that dimension, the embedding compression system 100 further concentrates signal energy and increases compressibility. Auxiliary information representing the reordering can be stored for use in subsequent restoration of the original ordering, enabling reconstruction of the embedding matrix while preserving structural correspondence among embedding values.

Further, in some embodiments, the embedding compression system 100 improves robustness and scalability of compression workflows for large embedding matrices by supporting region-based or partitioned processing. By compressing transformed embedding matrices in partitions or by regions with different dynamic characteristics, the system can reduce peak memory usage during compression and reconstruction and better accommodate large embedding matrices. For example, regions exhibiting predominantly LDR behavior may be compressed more aggressively than regions containing concentrated HDR coefficients resulting from energy compaction. These techniques allow the embedding compression system 100 to scale embedding storage and reuse across large collections of content items while maintaining consistent compression behavior.

Moreover, the embedding compression system 100 improves integration of compressed embedding matrices into downstream computing workflows by supporting reconstruction of embedding matrices through decoding and inverse decorrelating transforms. By storing compression metadata and, where applicable, auxiliary information associated with a compressed embedding matrix, the system enables reconstructed embedding matrices to be used in downstream operations such as index updates, retrieval and scoring, and other machine-learning or analysis tasks. This allows compressed embedding matrices to function as reusable internal data representations without requiring repeated regeneration from underlying content items.

Figure 2:
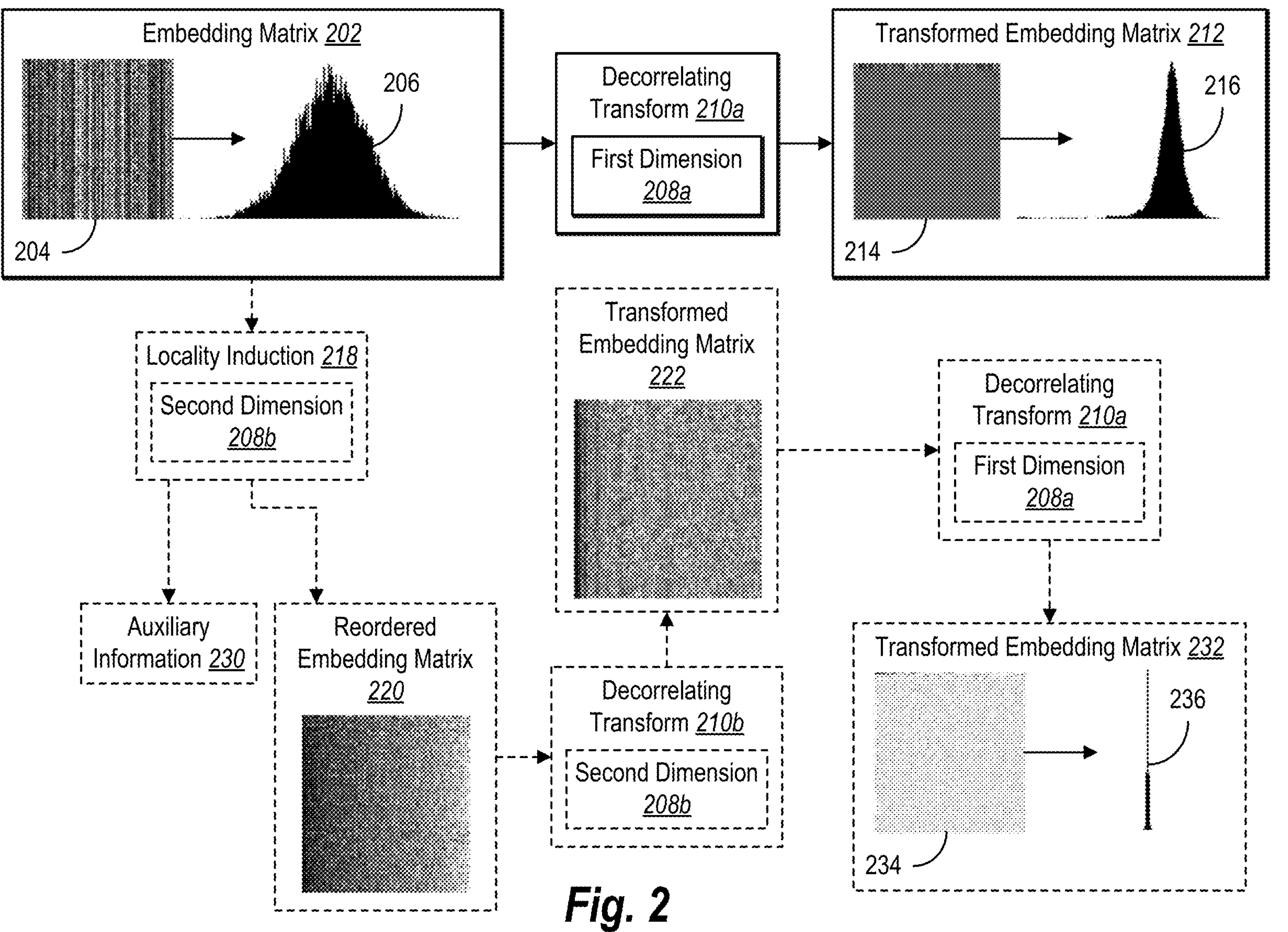
FIG. 2 illustrates the embedding compression system applying one or more decorrelating transforms to an embedding matrix in preparation for compression in accordance with one or more embodiments.

FIG. 2 illustrates example pre-compression processing operations performed by the embedding compression system 100 to prepare an embedding matrix for compression in accordance with one or more embodiments. In particular, FIG. 2 illustrates how, in various embodiments, the embedding compression system 100 applies one or more decorrelating transforms, optionally in combination with locality induction, to modify the numerical structure of an embedding matrix in a manner that improves compressibility while preserving underlying embedding information.

As shown in FIG. 2, the embedding compression system 100 processes an embedding matrix 202. The embedding matrix 202 may correspond to an embedding matrix generated for a content item as described above with respect to FIG. 1 or may be an embedding matrix obtained from an external source. In the illustrated example, the embedding matrix 202 includes a pixelated visualization 204 and a histogram 206, which are provided for explanatory purposes to illustrate characteristics of the data distribution within the embedding matrix 202.

As illustrated by the pixelated visualization 204, the embedding matrix 202 exhibits locality along a first dimension 208*a*. In particular, values within adjacent positions along the first dimension 208*a* tend to be similar, resulting in visible columns of similar shading in the pixelated visualization 204. In the illustrated orientation, the first dimension 208*a* corresponds to a vertical dimension of the pixelated visualization 204 (e.g., across rows of the embedding matrix 202). In some embodiments, the embedding compression system 100 expects such locality along the first dimension 208*a* based on how the embedding matrix 202 is generated, for example when embedding vectors correspond to an ordered sequence of tokens, token groups, or overlapping or adjacent segments of a content item that share contextual information. The histogram 206 further illustrates a distribution of values within the embedding matrix 202 that is relatively broad and approximately bell-shaped, indicating that signal energy—such as variance or magnitude of values—is distributed across a wide range of values prior to transformation or other pre-compression processing of the embedding matrix 202.

As illustrated, the embedding compression system 100 applies a decorrelating transform 210*a* across the first dimension 208*a* of the embedding matrix 202 (e.g., in response to determining that the embedding matrix 202 exhibits or is expected to exhibit locality in the first dimension 208*a*). As described above, a decorrelating transform reduces correlation among values along a selected dimension and tends to concentrate signal energy into fewer components. Applying the decorrelating transform 210*a* across the first dimension 208*a* produces a transformed embedding matrix 212.

In some embodiments, the embedding compression system 100 determines that locality is exhibited by evaluating similarity or correlation among adjacent values or adjacent embedding vectors along a particular dimension (e.g., based on one or more similarity, correlation, or variance metrics). In other embodiments, the embedding compression system 100 assumes or otherwise infers expected locality based on an embedding process or arrangement used to generate the embedding matrix 202. For example, when the embedding matrix 202 comprises token-ordered embeddings for a text content item, the embedding compression system 100 may expect locality because nearby tokens or token groups share contextual information, including in implementations in which the embedding process encodes overlapping segments or sliding windows of the content item. Similarly, when the embedding matrix 202 comprises patch- or tile-ordered latent visual token embeddings generated from an image representation of a document, the embedding compression system 100 may expect locality based on adjacency in a spatial ordering (e.g., a scan order across neighboring patches or tiles). In still other embodiments, when exhibited locality is not detected or is not otherwise expected, the embedding compression system 100 induces locality along a selected dimension (e.g., via reordering as described below) prior to applying the decorrelating transform 210*a.*

As shown in FIG. 2, the transformed embedding matrix 212 includes a pixelated visualization 214 and a histogram 216. The pixelated visualization 214 illustrates that signal energy has been compacted into an upper portion of the transformed embedding matrix 212. For example, in some embodiments, a first row of the transformed embedding matrix 212 may represent average values across the first dimension 208*a*, while remaining rows represent delta or residual values, resulting in noticeable variation in the upper portion of the matrix and comparatively small variation elsewhere. Correspondingly, the histogram 216 illustrates a more "peaky" distribution relative to the histogram 206, indicating reduced variance and increased concentration of values.

By concentrating signal energy into a smaller subset of coefficients and reducing the dynamic range of remaining values, the transformed embedding matrix 212 is more compressible, in that subsequent compression operations can represent the matrix using fewer bits while preserving numerically meaningful information. Notably, in some implementations, applying the decorrelating transform 210*a* alone—without additional processing along other dimensions—is sufficient to produce advantageous compression results. In some embodiments, this energy compaction causes portions of the transformed embedding matrix 212 to exhibit relatively high dynamic range (HDR), while other portions exhibit relatively low dynamic range (LDR). This separation of HDR and LDR regions enables downstream compression operations to apply different compression settings to different portions of the transformed embedding matrix (e.g., as described below in relation to FIG. 3), improving compression efficiency while maintaining reconstruction fidelity.

In a second processing pipeline illustrated in FIG. 2, the embedding compression system 100 applies locality induction to the embedding matrix 202 to improve compressibility along a second dimension 208*b*. In the illustrated orientation, the second dimension 208*b* corresponds to a horizontal dimension of the pixelated visualization 204 (e.g., across columns or across components of embedding vectors of the embedding matrix 202). In such embodiments, locality induction is performed prior to any decorrelating transform along the second dimension 208*b*. In some embodiments, locality induction is applied even when the embedding matrix 202 does not exhibit or is not expected to exhibit locality along the second dimension 208*b*, such as when the embedding compression system 100 determines that reordering may nevertheless improve downstream decorrelation or compression efficiency. In some embodiments, the embedding compression system 100 tests for locality along one or more dimensions-such as by evaluating similarity, correlation, variance, or related metrics- and selectively performs locality induction based on the results of such testing.

In performing the locality induction 218, the embedding compression system 100 reorders portions of the embedding matrix 202 based on values of the embedding matrix, such as aggregate values (e.g., sums, averages, norms, or other combined measures) associated with rows, columns, or other portions of the matrix. This reordering intentionally alters the original positional arrangement of values within the embedding matrix 202 and is therefore destructive with respect to the original ordering. As illustrated, the locality induction 218 produces a reordered embedding matrix 220 in which locality is increased along the second dimension 208*b*. As illustrated, a pixelated visualization within the reordered embedding matrix 220 shows more consistent shading from left to right, reflecting increased similarity among neighboring values along the second dimension 208*b*.

As also shown in FIG. 2, in association with the locality induction 218, the embedding compression system 100 generates auxiliary information 230. The auxiliary information 230 may include, for example, a permutation vector or other form of permutation information (e.g., a record of an ordering applied to rows, columns, or other portions of the embedding matrix 202), offset information, or index tables that represent how portions of the embedding matrix 202 were reordered. In some embodiments, for example, a permutation vector comprises a sequence of index values that maps each reordered position in the reordered embedding matrix 220 to a corresponding original position in the embedding matrix 202. As described in greater detail below, the embedding compression system 100 may store the auxiliary information 230 for use during subsequent reconstruction of the embedding matrix.

After reordering the embedding matrix 202 to produce the reordered embedding matrix 220, the embedding compression system 100 applies a decorrelating transform 210*b* across the second dimension 208*b* of the reordered embedding matrix 220. Applying the decorrelating transform 210*b* produces a transformed embedding matrix 222. As illustrated by a pixelated visualization of the transformed embedding matrix 222, this processing step results in partial energy compaction, with denser or darker values concentrated along a left-side portion of the matrix. By reducing correlation and concentrating energy along the second dimension 208*b*, the transformed embedding matrix 222 becomes more compressible, even if no decorrelating transform is applied along the first dimension 208*a*.

In the illustrated embodiment, the embedding compression system 100 next applies the decorrelating transform 210*a* across the first dimension 208*a* of the transformed embedding matrix 222 to produce a transformed embedding matrix 232. As shown, the transformed embedding matrix 232 includes a pixelated visualization 234 and a histogram 236. The pixelated visualization 234 illustrates signal energy compacted into an upper-left corner of the matrix, while the histogram 236 shows a significantly more "peaky" distribution (e.g., more condensed with less distribution and more concentration at fewer values which therefore peak higher) relative to the histograms 206 and 216. In this representation, high-magnitude coefficients are concentrated into a localized region of high dynamic range (HDR), while remaining portions of the matrix exhibit relatively low dynamic range (LDR). This combined transformation concentrates higher-dynamic-range values into a localized region of the transformed embedding matrix 232, while leaving remaining regions with comparatively lower dynamic range. As a result, the transformed embedding matrix 232 is particularly well suited for subsequent compression operations that apply different treatment to regions of differing dynamic range, enabling efficient compression with high fidelity, such as described in greater detail below with respect to FIG. 3.

Although FIG. 2 illustrates two example processing pipelines, the embedding compression system 100 is not limited to the illustrated ordering of operations. In some embodiments, the embedding compression system 100 may apply one or more decorrelating transforms along selected dimensions without performing locality induction, or may perform locality induction and decorrelation along fewer than all available dimensions. In other embodiments, the embedding compression system 100 may vary the ordering or selection of operations based on characteristics of the embedding matrix or the embedding process, while still producing transformed embedding matrices that are more amenable to compression (e.g., requiring fewer bits to represent values at a given level of reconstruction accuracy).

Figure 3:
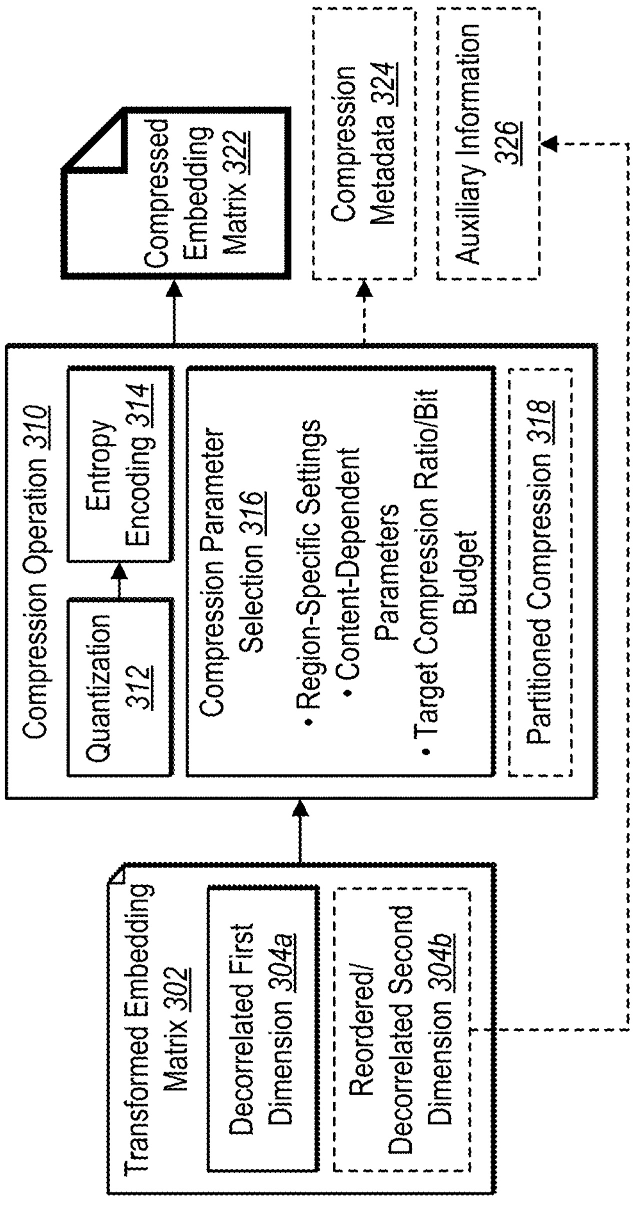
FIG. 3 illustrates the embedding compression system performing a compression operation on a transformed embedding matrix to generate a compressed embedding matrix in accordance with one or more embodiments.

FIG. 3 illustrates example compression operations performed by the embedding compression system 100 to generate a compressed embedding matrix from a transformed embedding matrix in accordance with one or more embodiments. As illustrated, FIG. 3 depicts how, in one or more embodiments, the embedding compression system 100 applies a sequence of compression-related actions to a transformed embedding matrix produced through pre-compression processing, such as the decorrelation and optional locality induction described above with respect to FIG. 2.

As shown in FIG. 3, the embedding compression system 100 generates, receives, or otherwise accesses a transformed embedding matrix 302. The transformed embedding matrix 302 may correspond, for example, to the transformed embedding matrix 212 or the transformed embedding matrix 232 described above with respect to FIG. 2. As illustrated in FIG. 3, the transformed embedding matrix 302 includes values that have been decorrelated along a first dimension 304*a* and, in some embodiments, reordered and decorrelated along a second dimension 304*b*. As a result of this prior processing, signal energy within the transformed embedding matrix 302 is concentrated into one or more sub-portions of the matrix, while remaining portions exhibit reduced dynamic range or increased statistical regularity.

As illustrated, the embedding compression system 100 applies the compression operation 310 to the transformed embedding matrix 302. In one or more embodiments, the compression operation 310 comprises one or more compression-related operations that collectively reduce the size of the transformed embedding matrix for storage or transmission. In the illustrated embodiment, the compression operation 310 includes a quantization 312 followed by an entropy encoding 314, although other combinations and sequences of compression operations may be used.

In performing the quantization 312, the embedding compression system 100 converts values of the transformed embedding matrix 302 to a reduced-precision representation. In various embodiments, quantization may include converting floating-point values to fixed-point representations, applying uniform or non-uniform quantization levels, truncating or rounding values, or mapping values to quantization bins with variable step sizes. Because signal energy in the transformed embedding matrix 302 is concentrated into a limited subset of values or regions, the embedding compression system 100 can apply quantization with reduced loss of numerically meaningful information relative to quantization applied directly to an untransformed embedding matrix.

Following quantization, the embedding compression system 100 applies the entropy encoding 314 to the quantized representation. Entropy encoding exploits statistical redundancy in the quantized values to further reduce storage size, for example by assigning shorter codes to more frequently occurring values and longer codes to less frequent values. In some embodiments, entropy encoding includes variable-length coding, arithmetic coding, range coding, run-length encoding, or other entropy-based encoding techniques. More generally, while FIG. 3 illustrates quantization followed by entropy encoding as one example, the embedding compression system 100 may employ other compression techniques, either in addition to or instead of those shown, including coefficient truncation, sparsification, predictive coding, or hybrid compression schemes that combine multiple approaches.

As further illustrated in FIG. 3, the embedding compression system 100 performs compression parameter selection 316 to control how the compression operation 310 is applied. In some embodiments, for example, the embedding compression system 100 selects compression parameters in view of a target degree of compression and/or based on one or more of characteristics of the transformed embedding matrix 302, characteristics of the associated content item, or operational constraints of the system. Example compression parameters include, without limitation, region-specific settings, content-dependent parameters, and target compression ratios or bit budgets. By selecting and adjusting such parameters, the embedding compression system 100 provides fine-grained control over compression behavior, including support for non-integer average numbers of bits per vector component and flexible tradeoffs between compression ratio and reconstruction fidelity.

In some embodiments, region-specific settings are selected based on differences in signal characteristics across the transformed embedding matrix 302. For example, the embedding compression system 100 may identify regions associated with higher dynamic range—such as regions containing concentrated signal energy—and apply higher-precision quantization or less aggressive entropy coding to those regions. Conversely, regions associated with lower dynamic range or smaller residual values may be quantized more aggressively or encoded with lower precision. This differentiated treatment allows the embedding compression system 100 to preserve accuracy in numerically significant portions of the matrix while reducing overall storage size. Moreover, such treatment enables the embedding compression system 100 to satisfy a target compression ratio or bit budget while preferentially allocating bits to regions that have greater impact on reconstruction accuracy.

In addition, in some embodiments, the embedding compression system 100 selects compression parameters based on characteristics of the content item or the embedding process. For example, different types of content items (e.g., short documents versus long documents, or different content domains) may result in embedding matrices with different statistical properties, and the embedding compression system 100 may adapt compression parameters accordingly.

As also shown in FIG. 3, the embedding compression system 100 optionally applies a partitioned compression 318. In some embodiments, the embedding compression system 100 partitions an embedding matrix into blocks, tiles, or other regions prior to applying one or more pre-compression processing operations (e.g., the decorrelating transform 210*a*, the decorrelating transform 210*b*, and/or the locality induction 218 described above with respect to FIG. 2), and then processes and compresses the partitions independently. In other embodiments, the embedding compression system 100 partitions the transformed embedding matrix 302 and compresses the partitions independently. In some embodiments, the embedding compression system 100 determines that different partitions exhibit different degrees of locality, energy concentration, or dynamic range and selects compression parameters separately for each partition. Partitioned compression can reduce peak memory usage, enable parallel processing, and further improve compression efficiency by tailoring preprocessing and compression behavior to localized matrix characteristics.

As a result of the compression operation 310, the embedding compression system 100 generates a compressed embedding matrix 322. In some embodiments, the embedding compression system 100 also generates compression metadata 324, which describes how the compression operation was performed. The compression metadata 324 may include, for example, quantization parameters, entropy-coding configurations, region or partition boundaries, actual or target compression ratios or bit budgets, or other information used to support subsequent decoding or reconstruction of the compressed embedding matrix 322.

In embodiments in which locality induction and reordering are performed prior to compression, the embedding compression system 100 associates auxiliary information 326 with the compressed embedding matrix 322. In such embodiments, the auxiliary information 326 represents how portions of the embedding matrix were reordered during pre-compression processing and is used during reconstruction to restore an original ordering of embedding values. When reordering occurs, inclusion of the auxiliary information 326 enables accurate reconstruction of the embedding matrix structure following decompression.

By applying compression operations to transformed embedding matrices in which signal energy has been compacted and dynamic range has been reduced, the embedding compression system 100 achieves improved compression efficiency relative to compressing untransformed embedding matrices. Moreover, these techniques enable flexible rate control, high-fidelity reconstruction, and efficient storage of embedding matrices for reuse in downstream operations, such as described in greater detail below with respect to FIG. 4.

Figure 4:
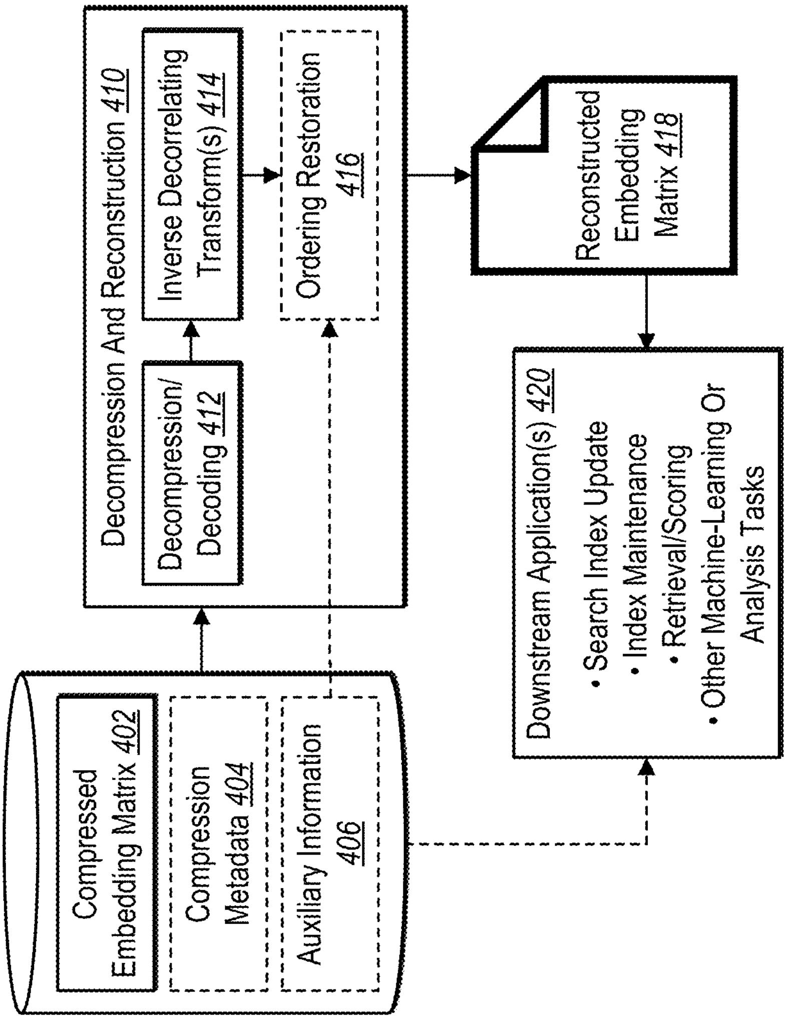
FIG. 4 illustrates the embedding compression system decompressing and reconstructing a compressed embedding matrix in preparation for downstream use in accordance with one or more embodiments.

FIG. 4 illustrates example decompression, reconstruction, and downstream use of compressed embedding matrices performed by the embedding compression system 100 in accordance with one or more embodiments. As illustrated, FIG. 4 depicts how, in one or more embodiments, the embedding compression system 100 accesses stored compressed representations of embedding matrices and reconstructs embedding matrices for use in downstream operations, while also supporting alternative embodiments in which compressed embedding matrices are used directly without full reconstruction.

As shown in FIG. 4, the embedding compression system 100 accesses stored compressed data associated with a content item. In the illustrated embodiment, the stored data includes a compressed embedding matrix 402 and, in some embodiments, compression metadata 404 and/or auxiliary information 406. In some implementations, the compressed embedding matrix 402 corresponds to an embedding matrix that has been processed and compressed as described above with respect to FIGS. 2 and 3. The compression metadata 404, when present, describes parameters and settings used during compression, such as quantization parameters, entropy-coding configurations, partitioning information, or related details. The auxiliary information 406 is included in embodiments in which locality induction and reordering were performed and represents how portions of the embedding matrix were reordered prior to compression.

As illustrated, the embedding compression system 100 performs decompression and reconstruction 410 using the stored compressed data. As illustrated, the embedding compression system 100 first performs decompression or decoding 412 to reverse the compression operation applied during compression. In various embodiments, decompression includes reversing entropy encoding, reconstructing quantized values, or otherwise recovering an intermediate numerical representation corresponding to a transformed embedding matrix. While FIG. 4 illustrates one example decoding sequence, other decompression techniques may be used depending on the compression techniques applied, including decoding of variable-length codes, reconstruction of sparsified representations, or recovery of coefficients selected or truncated during compression, such as described above with respect to FIG. 3.

Following decompression, the embedding compression system 100 applies one or more inverse decorrelating transforms 414. The inverse decorrelating transform(s) 414 correspond to the decorrelating transforms applied during pre-compression processing, such as the inverse of the first-dimension decorrelating transform 210*a* and, where applicable, the inverse of the second-dimension decorrelating transform 210*b* described above with respect to FIG. 2. Applying the inverse decorrelating transform(s) 414 restores correlations among values along the corresponding dimensions of the embedding matrix and produces a numerical representation that more closely approximates the original embedding matrix structure.

In embodiments in which locality induction and reordering were performed prior to compression, the embedding compression system 100 further performs an ordering restoration 416. As illustrated, the embedding compression system 100 uses the auxiliary information 406 to restore an original ordering of portions of the embedding matrix that were reordered during pre-compression processing, such as by applying inverse permutations, offset adjustments, or index-based reassembly operations. In some embodiments, for example, the embedding compression system 100 applies a stored permutation vector to restore rows, columns, or other portions of the embedding matrix to their original ordering. Additional examples of locality induction and reordering operations, as well as corresponding restoration processes, are described above with respect to FIG. 2.

As a result of decompression, inverse transformation, and, where applicable, ordering restoration, the embedding compression system 100 produces a reconstructed embedding matrix 418. The fidelity of the reconstructed embedding matrix 418 relative to the original embedding matrix reflects compression parameters selected during compression, such as quantization precision, region-specific settings for high-dynamic-range and low-dynamic-range regions, partition-specific parameters, and target compression ratios or bit budgets as described above with respect to FIG. 3. In some embodiments, the embedding compression system 100 selects these parameters to balance storage efficiency against numerical accuracy based on characteristics of the content item, the embedding process, or downstream use requirements, such that reconstructed embedding matrices retain sufficient precision for their intended applications while achieving reduced storage footprint.

As further illustrated in FIG. 4, the embedding compression system 100 provides the reconstructed embedding matrix 418 to one or more downstream applications 420. For example, in an information retrieval system, the embedding compression system 100 may update a search index (e.g., for searching among stored and/or web-based content items) by (i) identifying one or more content items whose embeddings are affected by an index update or maintenance operation, (ii) reconstructing corresponding embedding matrices from stored compressed representations, (iii) computing similarity scores or relevance measures between reconstructed embeddings and query embeddings or other index entries, and (iv) updating index structures, postings, or ranking metadata accordingly. In other embodiments, reconstructed embedding matrices are used for retrieval and scoring in response to search queries, clustering or classification tasks, analytics, or other machine-learning workflows that operate on embedding representations.

In addition to the primary reconstruction path, FIG. 4 also illustrates an alternative embodiment in which the embedding compression system 100 provides the compressed embedding matrix 402 directly to downstream applications 420 without fully reconstructing the embedding matrix. For example, in some embodiments, a downstream system may compute approximate similarity scores, filtering operations, or coarse candidate selection directly from compressed or partially decoded representations, such as using compressed-domain distance estimates or selectively decoding only portions of the embedding matrix. In such cases, full reconstruction may be deferred or omitted when approximate results are sufficient.

In further embodiments, downstream systems perform approximate similarity scoring, coarse candidate selection, filtering, or pre-ranking operations directly on compressed or partially decoded representations, such as by computing distance estimates in the compressed domain or selectively decoding only high-dynamic-range portions of the embedding matrix. Other downstream applications that may not require full reconstruction include approximate nearest-neighbor indexing, cache-based retrieval, lightweight analytics (e.g., distributional analysis, clustering heuristics, anomaly detection, or content deduplication checks), or early-stage screening tasks (e.g., identifying candidate documents for deeper ranking, routing content to specialized processing pipelines, enforcing threshold-based inclusion or exclusion rules, or prioritizing items for subsequent embedding reconstruction) in which compressed embeddings provide sufficient signal for decision-making.

By enabling embedding matrices to be stored in a compressed form with high fidelity relative to their original representations, the embedding compression system 100 reduces storage requirements while preserving the numerical characteristics needed for a broad range of downstream operations. In addition, the embedding compression system 100 provides flexibility to adapt compression behavior based on content item type, embedding characteristics, and downstream application requirements. For example, different compression settings may be selected for different types of content items, different embedding models, or different operational contexts, allowing the system to balance storage efficiency, reconstruction fidelity, and computational overhead as needed. These capabilities allow embedding-based systems to maintain large and diverse collections of embedding matrices with reduced storage footprint, improved scalability, and minimized recomputation overhead, while remaining adaptable to evolving applications and usage scenarios.

Figure 5:
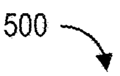
FIG. 5 illustrates an example flowchart of a series of acts for compressing an embedding matrix for a content item in accordance with one or more embodiments.
Figure 5:
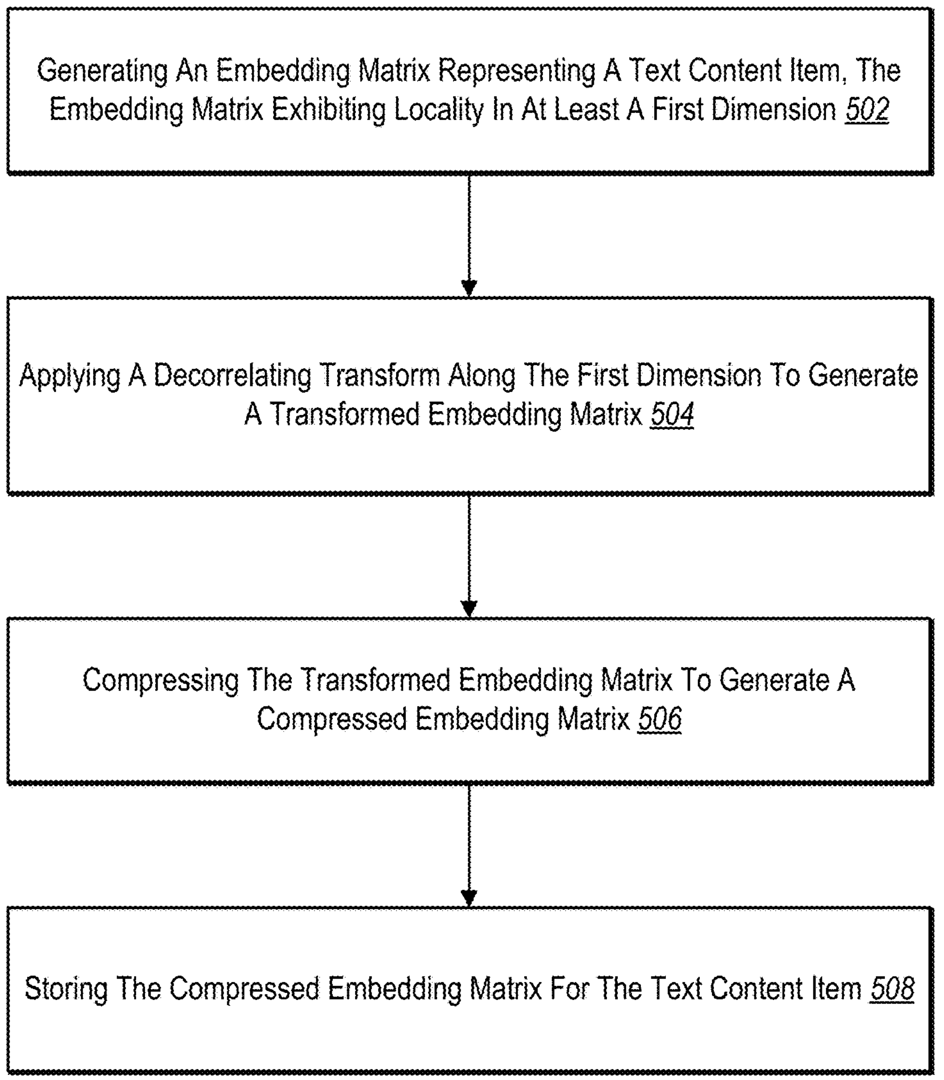

FIGS. 1-4, the corresponding text and the examples provide a number of different systems and methods for preparation and compression of embedding matrices for storage and reuse. In addition to the foregoing, implementations can also be described in terms of flowcharts comprising steps in a method for accomplishing a particular result, such as shown in FIG. 5. For example, FIG. 5 illustrates an example series of acts 500 for generating and storing a compressed embedding matrix for a text content item in accordance with one or more embodiments of the present disclosure.

While FIG. 5 illustrates acts according to particular embodiments, alternative embodiments may omit, add to, reorder, and/or modify any of the acts shown in FIG. 5 and disclosed below in relation to FIG. 5. In some cases, the acts of FIG. 5 are performed as part of a computer-implemented method. Alternatively, a non-transitory computer readable medium comprises instructions that, when executed by one or more processors, cause a computing device to perform the acts of FIG. 5. In still further embodiments, a system performs the acts of FIG. 5. Additionally, the acts described herein may be repeated or performed in parallel with one another or in parallel with different instances of the same or similar acts.

As shown in FIG. 5, the series of acts 500 includes an act 502 of generating an embedding matrix representing a text content item, the embedding matrix exhibiting locality in at least a first dimension, an act 504 of applying a decorrelating transform along the first dimension to generate a transformed embedding matrix, an act 506 of compressing the transformed embedding matrix to generate a compressed embedding matrix, and an act 508 of storing the compressed embedding matrix for the text content item.

For example, the series of acts 500 can include acts to perform any of the operations described in the following clauses:

CLAUSE 1. A computer-implemented method comprising:

generating an embedding matrix comprising a plurality of embedding vectors representing a text content item, the plurality of embedding vectors exhibiting locality in a first dimension of the embedding matrix;

applying a decorrelating transform along the first dimension of the embedding matrix to generate a transformed embedding matrix by compacting energy distributed across the embedding matrix in the first dimension into a sub-portion of the transformed embedding matrix;

compressing the transformed embedding matrix by performing a compression operation to generate a compressed embedding matrix; and storing the compressed embedding matrix for the text content item.

CLAUSE 2. The computer-implemented method of clause 1, further comprising:

inducing locality along a second dimension of the embedding matrix by reordering portions of the embedding matrix based on aggregate values of the embedding matrix; and in response to inducing the locality along the second dimension, applying a second decorrelating transform along the second dimension, in addition the decorrelating transform along the first dimension, to generate the transformed embedding matrix.

CLAUSE 3. The computer-implemented method of clause 2, further comprising storing, with the compressed embedding matrix, auxiliary information representing the reordering of the portions of the embedding matrix, the auxiliary information for use in later restoration of an original ordering of the portions of the embedding matrix.

CLAUSE 4. The computer-implemented method of clause 3, wherein the auxiliary information comprises at least one of permutation information, offset information, or an index table.

CLAUSE 5. The computer-implemented method of any of clauses 1-4, wherein applying the decorrelating transform comprises applying a wavelet transform.

CLAUSE 6. The computer-implemented method of any of clauses 1-5, wherein compressing the transformed embedding matrix comprises quantizing values of the transformed embedding matrix to a fixed-point representation.

CLAUSE 7. The computer-implemented method of clause 6, wherein compressing the transformed embedding matrix further comprises entropy encoding the fixed-point representation.

CLAUSE 8. The computer-implemented method of any of clauses 1-7, further comprising:

identifying a high-dynamic-range region and a low-dynamic-range region of the transformed embedding matrix; and compressing the high-dynamic-range region and the low-dynamic-range region using different compression settings.

CLAUSE 9. The computer-implemented method of any of clauses 1-8, further comprising generating a decompressed embedding matrix by decoding the compressed embedding matrix and applying an inverse decorrelating transform to reconstruct the embedding matrix.

CLAUSE 10. The computer-implemented method of any of clauses 1-9, further comprising:

selecting a target compression ratio for the embedding matrix based on one or more characteristics of the text content item;

adjusting one or more parameters of the compression operation based on the target compression ratio; and generating the compressed embedding matrix with a non-integer average number of bits per vector component.

CLAUSE 11. A system comprising:

at least one processor; and a non-transitory computer readable medium comprising instructions that, when executed by the at least one processor, cause the system to:

generate an embedding matrix comprising a plurality of embedding vectors representing a text content item, the embedding matrix having values arranged along a first dimension expected to exhibit locality among the plurality of embedding vectors;

apply a decorrelating transform along the first dimension of the embedding matrix to generate a transformed embedding matrix, the decorrelating transform applied to compact energy distributed across the embedding matrix in the first dimension into a sub-portion of the transformed embedding matrix;

compress the transformed embedding matrix by performing a compression operation to generate a compressed embedding matrix; and store the compressed embedding matrix for the text content item.

CLAUSE 12. The system of clause 11, further comprising instructions that, when executed by the at least one processor, cause the system to store the compressed embedding matrix in non-volatile storage.

CLAUSE 13. The system of any of clauses 11-12, further comprising instructions that, when executed by the at least one processor, cause the system to update a search index of an information retrieval system using the compressed embedding matrix, the search index enabling identification of one or more candidate text content items responsive to a search query.

CLAUSE 14. The system of clause 13, further comprising instructions that, when executed by the at least one processor, cause the system to reuse a previously stored compressed embedding matrix during index maintenance for the text content item without regenerating the embedding matrix from the text content item.

CLAUSE 15. The system of any of clauses 11-14, further comprising instructions that, when executed by the at least one processor, cause the system to:

reorder portions of the embedding matrix based on aggregate values of the embedding matrix, the reordering performed before or after applying the decorrelating transform along the first dimension;

apply a second decorrelating transform along a second dimension of the embedding matrix, after the reordering, to generate the transformed embedding matrix; and compress the transformed embedding matrix by performing the compression operation to generate the compressed embedding matrix.

CLAUSE 16. A non-transitory computer-readable medium comprising instructions that, when executed by at least one processor, cause the at least one processor to:

generate an embedding matrix comprising a plurality of embedding vectors representing a text content item;

select a first dimension of the embedding matrix for application of a decorrelating transform based on an expected locality among values of the embedding matrix along the first dimension;

apply the decorrelating transform along the first dimension of the embedding matrix to generate a transformed embedding matrix by compacting energy distributed across the embedding matrix in the first dimension into a sub-portion of the transformed embedding matrix; and compress the transformed embedding matrix by performing a compression operation to generate a compressed embedding matrix.

CLAUSE 17. The non-transitory computer-readable medium of clause 16, further comprising instructions that, when executed by the at least one processor, cause the at least one processor to store the compressed embedding matrix in non-volatile storage for use in updating a search index of an information retrieval system.

CLAUSE 18. The non-transitory computer-readable medium of any of clauses 16-17, wherein selecting the first dimension comprises selecting a dimension that orders the plurality of embedding vectors according to an ordering of tokens or token groups of the text content item.

CLAUSE 19. The non-transitory computer-readable medium of any of clauses 16-18, wherein selecting the first dimension based on the expected locality comprises selecting the first dimension based on the embedding matrix being generated using an embedding process that encodes the text content item using overlapping segments or sliding windows.

CLAUSE 20. The non-transitory computer-readable medium of clauses 16-19, further comprising instructions that, when executed by the at least one processor, cause the at least one processor to:

select a target bit budget or a target compression ratio for the embedding matrix based on one or more characteristics of the text content item; and adjust at least one of a quantization parameter, an entropy-coding parameter, or a coefficient-selection parameter for the compression operation based on the target bit budget or the target compression ratio.

Figure 6:
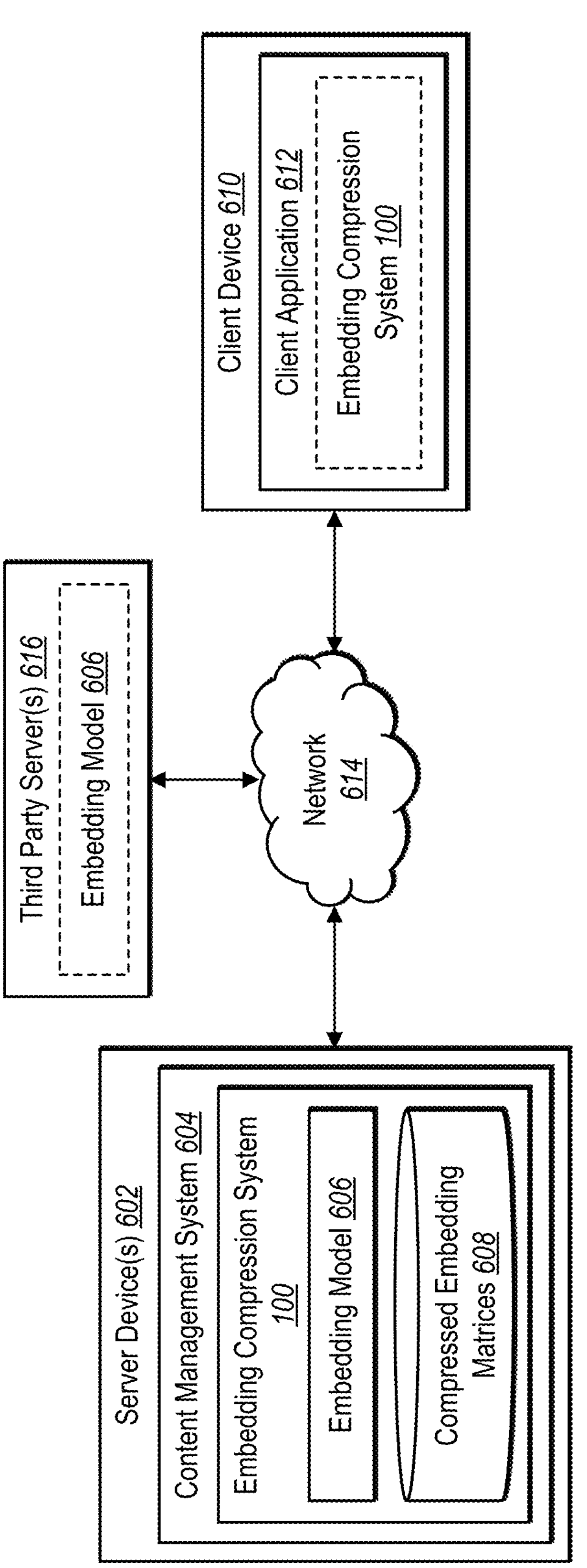
FIG. 6 illustrates a diagram of an environment in which the embedding compression system can operate in accordance with one or more embodiments.

FIG. 6 illustrates a schematic diagram of an example system environment for implementing the embedding compression system 100 in accordance with one or more implementations. As shown, the system environment 600 includes server device(s) 602, a client device 610, third-party server (s) 616, and a network 614. Each of the components of the system environment 600 can communicate via the network 614, and the network 614 may be any suitable network over which computing devices can communicate. Example networks are discussed in more detail below in relation to FIGS. 7-8.

As mentioned above, the example system environment 600 includes a client device 610. The client device 610 can be one of a variety of computing devices, including a smartphone, a tablet, a smart television, a desktop computer, a laptop computer, a virtual reality device, an augmented reality device, or another computing device as described in relation to FIGS. 7-8. The client device 610 can communicate with the server device(s) 602 via the network 614. For example, the client device 610 can receive user input from a user interacting with the client device 610 (e.g., via a client application 612) to, for instance, initiate, configure, or interact with embedding compression operations or downstream workflows that utilize compressed embedding matrices. In addition, the embedding compression system 100 on the server device(s) 602 can receive information relating to various interactions with graphical user interface elements based on the input received by the client device 610 (e.g., to configure compression settings, manage stored embedding matrices, or control embedding-based workflows).

As shown, the client device 610 can include a client application 612. In particular, the client application 612 may be a web application, a native application installed on the client device 610 (e.g., a mobile application, a desktop application, etc.), or a cloud-based application where all or part of the functionality is performed by the server device(s) 602. Based on instructions from the client application 612, the client device 610 can present or display information, including content items, compression settings, stored embedding representations, status information, and other data associated with embedding-based workflows.

As illustrated in FIG. 6, the example environment also includes the server device(s) 602. The server device(s) 602 may generate, track, store, process, receive, search, and transmit electronic data, such as content items, embedding matrices, compressed embedding matrices, compression metadata, auxiliary information, and related configuration data. In addition, the server device(s) 602 can transmit data to the client device 610 in the form of a graphical user interface that includes a window, tab, and/or input field for initiating, requesting, or adjusting embedding compression operations or related system settings. Indeed, the server device(s) 602 can communicate with the client device 610 to send and/or receive data via the network 614. In some implementations, the server device(s) 602 comprise a distributed server environment including a number of server devices distributed across the network 614 and located in different physical locations. The server device(s) 602 can comprise one or more content servers, application servers, communication servers, web-hosting servers, machine-learning servers, and other types of servers.

As shown in FIG. 6, the server device(s) 602 host a content management system 604. The content management system 604 can manage, store, synchronize, version, and maintain content items for one or more user accounts, and can further maintain embedding-based representations associated with such content items. In particular, the content management system 604 includes the embedding compression system 100, which can generate and/or obtain embedding matrices for content items, perform pre-compression processing and compression operations, and store resulting compressed embedding matrices. As illustrated, the embedding compression system 100 includes an embedding model 606, which the embedding compression system 100 may execute locally on the server device(s) 602 to generate embeddings for content items. The embedding compression system 100 further includes compressed embedding matrices 608 (e.g., persisted within non-volatile storage), which represent compressed embedding matrices stored for reuse, such as during index maintenance, retrieval operations, or other embedding-driven workflows supported by the content management system 604.

FIG. 6 further illustrates one or more third-party server(s) 616. In particular, the third-party server(s) 616 may host or provide access to an embedding model 606 used to generate embedding vectors or embedding matrices for content items. For example, the third-party server(s) 616 can include a server location hosting an embedding model that is external to the embedding compression system 100 and the content management system 604. In some embodiments, the embedding compression system 100 accesses the embedding model 606 via one or more connectors, plugins, application programming interfaces (APIs), or other network-based access mechanisms.

Although FIG. 6 depicts the embedding compression system 100 located on the server device(s) 602, in some implementations, the embedding compression system 100 may be implemented by (e.g., located entirely or in part on) one or more other components of the environment. For example, the embedding compression system 100 may be implemented by the client device 610 and/or a third-party device. For example, the client device 610 can download all or part of the embedding compression system 100 for implementation independent of, or together with, the server device(s) 602.

In some implementations, though not illustrated in FIG. 6, the environment may have a different arrangement of components and/or may have a different number or set of components altogether. For example, the client device 610 may communicate directly with the embedding compression system 100 bypassing the network 614. As another example, the environment can include storage for compressed embedding matrices located external to the server device(s) 602 (e.g., in communication via the network 614) or located on the server device(s) 602, on the third-party server(s) 616, and/or on the client device 610.

In one or more implementations, each of the components of the embedding compression system 100 are in communication with one another using any suitable communication technologies. Additionally, the components of the embedding compression system 100 can be in communication with one or more other devices including one or more client devices described above. It will be recognized that in as much the embedding compression system 100 is shown to be separate in the above description, any of the subcomponents may be combined into fewer components, such as into a single component, or divided into more components as may serve a particular implementation.

Figure 7:
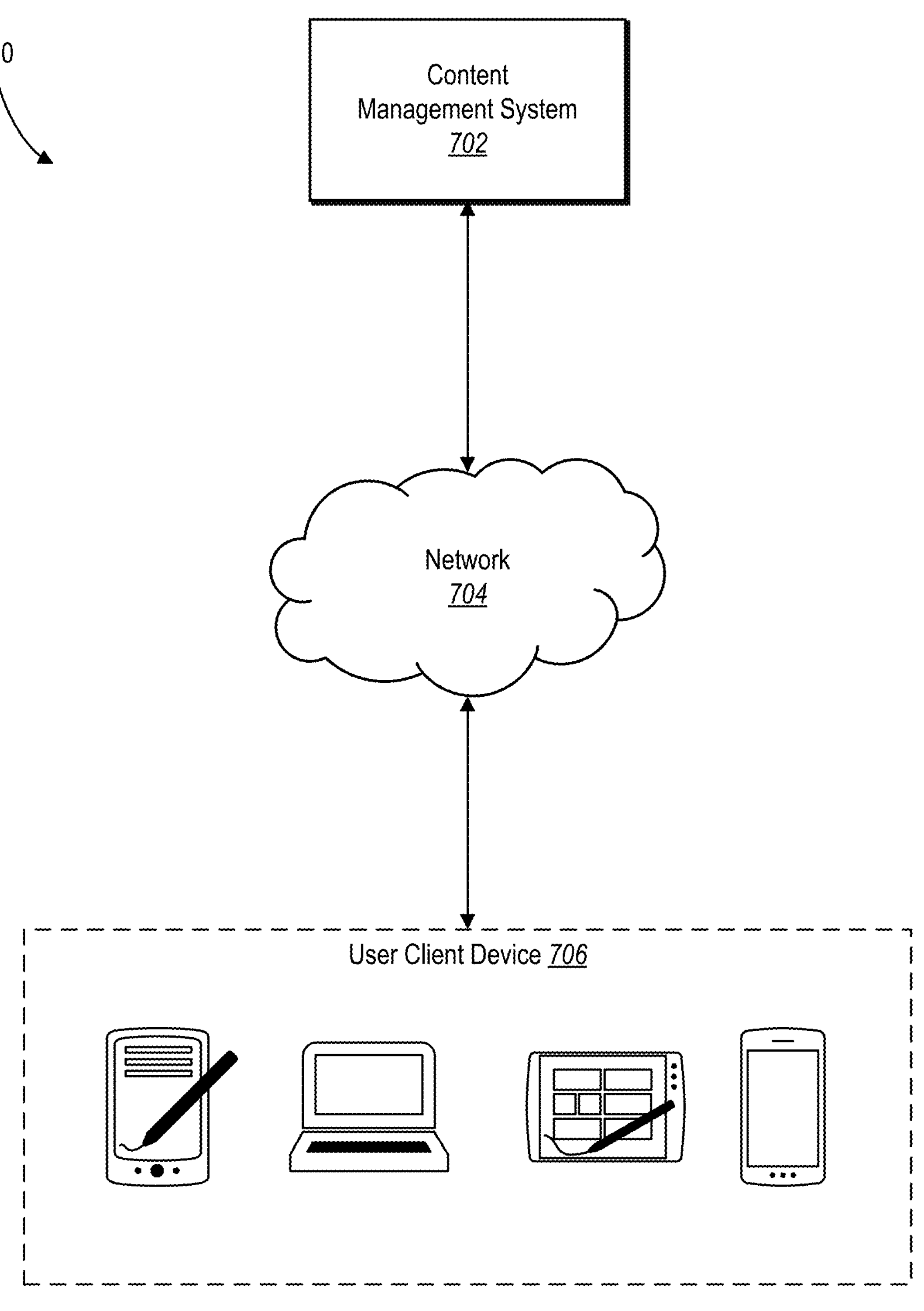
FIG. 7 illustrates an example environment of a networking system including the embedding compression system in accordance with one or more embodiments.

FIG. 7 is a schematic diagram illustrating environment 700 within which one or more implementations of the embedding compression system 100 can be implemented. As discussed above with respect to FIG. 6, in some embodiments, the embedding compression system 100 can be part of a content management system 702. In one or more embodiments, the content management system 702 may generate, store, manage, receive, and send digital content (such as digital images or videos). For example, content management system 702 may send and receive digital content to and from the user client device 706 by way of network 704. In particular, the content management system 702 can store and manage a collection of digital content. The content management system 702 can manage the sharing of digital content between computing devices associated with a plurality of users. For instance, the content management system 702 can facilitate a user sharing a digital content with another user of content management system 702.

In particular, the content management system 702 can manage synchronizing digital content across multiple of the user client device 706 associated with one or more users. For example, a user may edit digital content using user client device 706. The content management system 702 can cause user client device 706 to send the edited digital content to content management system 702. Content management system 702 then synchronizes the edited digital content on one or more additional computing devices.

In addition to synchronizing digital content across multiple devices, one or more implementations of content management system 702 can provide an efficient storage option for users that have large collections of digital content. For example, content management system 702 can store a collection of digital content on content management system 702, while the user client device 706 only stores reduced-sized versions of the digital content. A user can navigate and browse the reduced-sized versions (e.g., a thumbnail of a digital image) of the digital content on user client device 706. In particular, one way in which a user can experience digital content is to browse the reduced-sized versions of the digital content on user client device 706.

Another way in which a user can experience digital content is to select a reduced-size version of digital content to request the full- or high-resolution version of digital content from content management system 702. In particular, upon a user selecting a reduced-sized version of digital content, user client device 706 sends a request to content management system 702 requesting the digital content associated with the reduced-sized version of the digital content. Content management system 702 can respond to the request by sending the digital content to user client device 706. User client device 706, upon receiving the digital content, can then present the digital content to the user. In this way, a user can have access to large collections of digital content while minimizing the number of resources used on user client device 706.

User client device 706 may be a desktop computer, a laptop computer, a tablet computer, a personal digital assistant (PDA), an in- or out-of-car navigation system, a handheld device, a smart phone or other cellular or mobile phone, or a mobile gaming device, other mobile device, or other suitable computing devices. User client device 706 may execute one or more client applications, such as a web browser (e.g., Microsoft Windows Internet Explorer, Mozilla Firefox, Apple Safari, Google Chrome, Opera, etc.) or a native or special-purpose client application (e.g., Dropbox Paper for iPhone or iPad, Dropbox Paper for Android, etc.), to access and view content over network 704.

Network 704 may represent a network or collection of networks (such as the Internet, a corporate intranet, a virtual private network (VPN), a local area network (LAN), a wireless local area network (WLAN), a cellular network, a wide area network (WAN), a metropolitan area network (MAN), or a combination of two or more such networks) over which the user client device 706 may access content management system 702.

In the foregoing specification, the present disclosure has been described with reference to specific exemplary implementations thereof. Various implementations and aspects of the present disclosure(s) are described with reference to details discussed herein, and the accompanying drawings illustrate the various implementations. The description above and drawings are illustrative of the disclosure and are not to be construed as limiting the disclosure. Numerous specific details are described to provide a thorough understanding of various implementations of the present disclosure.

The present disclosure may be embodied in other specific forms without departing from its spirit or essential characteristics. The described implementations are to be considered in all respects only as illustrative and not restrictive. For example, the methods described herein may be performed with less or more steps/acts or the steps/acts may be performed in differing orders. Additionally, the steps/acts described herein may be repeated or performed in parallel with one another or in parallel with different instances of the same or similar steps/acts. The scope of the present application is, therefore, indicated by the appended claims rather than by the foregoing description. All changes that come within the meaning and range of equivalency of the claims are to be embraced within their scope.

Figure 8:
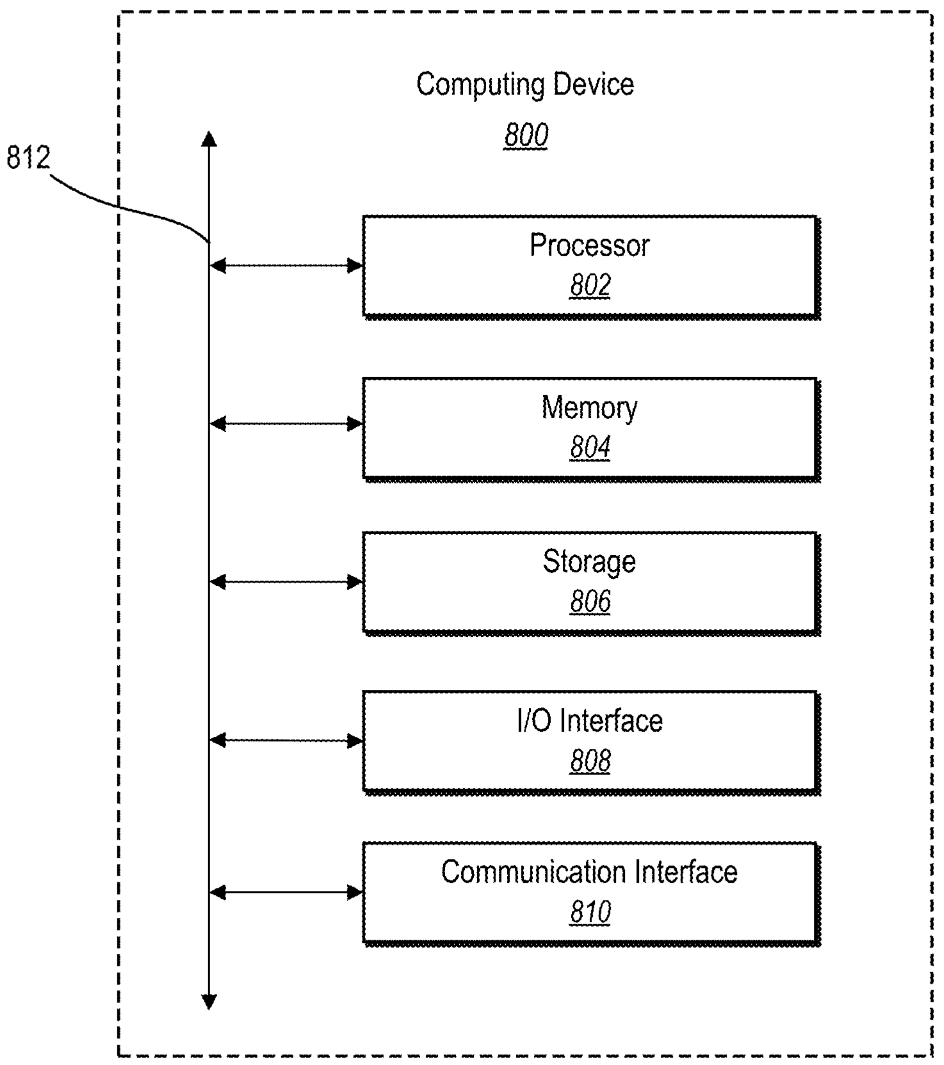
FIG. 8 illustrates a block diagram of an exemplary computing device in accordance with one or more embodiments.

FIG. 8 illustrates a block diagram of exemplary computing device 800 that may be configured to perform one or more of the processes described above. The components of the embedding compression system 100 can include software, hardware, or both. For example, the components of the embedding compression system 100 can include one or more instructions stored on a computer-readable storage medium and executable by processors of one or more computing devices (e.g., the computing device 800). When executed by the one or more processors, the computer-executable instructions of the embedding compression system 100 can cause the computing device 800 to perform the methods described herein. Alternatively, the components of the embedding compression system 100 can comprise hardware, such as a special purpose processing device to perform a certain function or group of functions. Additionally, or alternatively, the components of the embedding compression system 100 can include a combination of computer-executable instructions and hardware.

Furthermore, the components of the embedding compression system 100 performing the functions described herein may, for example, be implemented as part of a stand-alone application, as a module of an application, as a plug-in for applications including content management applications, as a library function or functions that may be called by other applications, and/or as a cloud-computing model. Thus, the components of the embedding compression system 100 may be implemented as part of a stand-alone application on a personal computing device or a mobile device.

Implementations of the present disclosure may comprise or utilize a special purpose or general-purpose computer including computer hardware, such as, for example, one or more processors and system memory, as discussed in greater detail below. Implementations within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., a memory, etc.), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, implementations of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed by a processor, cause a general-purpose computer, special purpose computer, or special purpose processing device to perform a certain function or group of functions. In some implementations, computer-executable instructions are executed on a general-purpose computer to turn the general-purpose computer into a special purpose computer implementing elements of the disclosure. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including personal computers, desktop computers, laptop computers, message processors, hand-held devices, multiprocessor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Implementations of the present disclosure can also be implemented in cloud computing environments. In this description, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In this description and in the claims, a "cloud-computing environment" is an environment in which cloud computing is employed.

As mentioned, FIG. 8 illustrates a block diagram of exemplary computing device 800 that may be configured to perform one or more of the processes described above. One will appreciate that third-party server(s) 616, the client device 610, and/or the computing device 800 may comprise one or more computing devices such as computing device 800. As shown by FIG. 8, computing device 800 can comprise processor 802, memory 804, a storage device, a I/O interface, and communication interface 810, which may be communicatively coupled by way of communication infrastructure 812. While an exemplary computing device 800 is shown in FIG. 8, the components illustrated in FIG. 8 are not intended to be limiting. Additional or alternative components may be used in other implementations. Furthermore, in certain implementations, computing device 800 can include fewer components than those shown in FIG. 8. Components of computing device 800 shown in FIG. 8 will now be described in additional detail.

In particular implementations, processor 802 includes hardware for executing instructions, such as those making up a computer program. As an example, and not by way of limitation, to execute instructions, processor 802 may retrieve (or fetch) the instructions from an internal register, an internal cache, memory 804, or storage device 806 and decode and execute them. In particular implementations, processor 802 may include one or more internal caches for data, instructions, or addresses. As an example, and not by way of limitation, processor 802 may include one or more instruction caches, one or more data caches, and one or more translation lookaside buffers (TLBs). Instructions in the instruction caches may be copies of instructions in memory 804 or storage device 806.

Memory 804 may be used for storing data, metadata, and programs for execution by the processor(s). Memory 804 may include one or more of volatile and non-volatile memories, such as Random Access Memory ("RAM"), Read Only Memory ("ROM"), a solid-state disk ("SSD"), Flash, Phase Change Memory ("PCM"), or other types of data storage. Memory 804 may be internal or distributed memory.

Storage device 806 includes storage for storing data or instructions. As an example, and not by way of limitation, storage device 806 can comprise a non-transitory storage medium described above. Storage device 806 may include a hard disk drive (HDD), a floppy disk drive, flash memory, an optical disc, a magneto-optical disc, magnetic tape, or a Universal Serial Bus (USB) drive or a combination of two or more of these. Storage device 806 may include removable or non-removable (or fixed) media, where appropriate. Storage device 806 may be internal or external to computing device 800. In particular implementations, storage device 806 is non-volatile, solid-state memory. In other implementations, storage device 806 includes read-only memory (ROM). Where appropriate, this ROM may be mask programmed ROM, programmable ROM (PROM), erasable PROM (EPROM), electrically erasable PROM (EEPROM), electrically alterable ROM (EAROM), or flash memory or a combination of two or more of these.

I/O interface 808 allows a user to provide input to, receive output from, and otherwise transfer data to and receive data from computing device 800. I/O interface 808 may include a mouse, a keypad or a keyboard, a touch screen, a camera, an optical scanner, network interface, modem, other known I/O devices or a combination of such I/O interfaces. I/O interface 808 may include one or more devices for presenting output to a user, including, but not limited to, a graphics engine, a display (e.g., a display screen), one or more output drivers (e.g., display drivers), one or more audio speakers, and one or more audio drivers. In certain implementations, I/O interface 808 is configured to provide graphical data to a display for presentation to a user. The graphical data may be representative of one or more graphical interfaces and/or any other graphical content as may serve a particular implementation.

Communication interface 810 can include hardware, software, or both. In any event, communication interface 810 can provide one or more interfaces for communication (such as, for example, packet-based communication) between computing device 800 and one or more other computing devices or networks. As an example and not by way of limitation, communication interface 810 may include a network interface controller (NIC) or network adapter for communicating with an Ethernet or other wire-based network or a wireless NIC (WNIC) or wireless adapter for communicating with a wireless network, such as a WI-FI.

Additionally or alternatively, communication interface 810 may facilitate communications with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, communication interface 810 may facilitate communications with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination thereof.

Additionally, communication interface 810 may facilitate communications various communication protocols. Examples of communication protocols that may be used include, but are not limited to, data transmission media, communications devices, Transmission Control Protocol ("TCP"), Internet Protocol ("IP"), File Transfer Protocol ("FTP"), Telnet, Hypertext Transfer Protocol ("HTTP"), Hypertext Transfer Protocol Secure ("HTTPS"), Session Initiation Protocol ("SIP"), Simple Object Access Protocol ("SOAP"), Extensible Mark-up Language ("XML") and variations thereof, Simple Mail Transfer Protocol ("SMTP"), Real-Time Transport Protocol ("RTP"), User Datagram Protocol ("UDP"), Global System for Mobile Communications ("GSM") technologies, Code Division Multiple Access ("CDMA") technologies, Time Division Multiple Access ("TDMA") technologies, Short Message Service ("SMS"), Multimedia Message Service ("MMS"), radio frequency ("RF") signaling technologies, Long Term Evolution ("LTE") technologies, wireless communication technologies, in-band and out-of-band signaling technologies, and other suitable communications networks and technologies.

Communication infrastructure 812 may include hardware, software, or both that couples components of computing device 800 to each other. As an example and not by way of limitation, communication infrastructure 812 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination thereof.

The foregoing specification is described with reference to specific exemplary implementations thereof. Various implementations and aspects of the disclosure are described with reference to details discussed herein, and the accompanying drawings illustrate the various implementations. The description above and drawings are illustrative and are not to be construed as limiting. Numerous specific details are described to provide a thorough understanding of various implementations.

The additional or alternative implementations may be embodied in other specific forms without departing from its spirit or essential characteristics. The described implementations are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A computer-implemented method comprising:

generating an embedding matrix comprising a plurality of embedding vectors representing a text content item, the plurality of embedding vectors exhibiting locality in a first dimension of the embedding matrix;

applying a decorrelating transform along the first dimension of the embedding matrix to generate a transformed embedding matrix by compacting energy distributed across the embedding matrix in the first dimension into a sub-portion of the transformed embedding matrix;

compressing the transformed embedding matrix by performing a compression operation to generate a compressed embedding matrix; and storing the compressed embedding matrix for the text content item.

2. The computer-implemented method of claim 1, further comprising:

inducing locality along a second dimension of the embedding matrix by reordering portions of the embedding matrix based on aggregate values of the embedding matrix; and in response to inducing the locality along the second dimension, applying a second decorrelating transform along the second dimension, in addition the decorrelating transform along the first dimension, to generate the transformed embedding matrix.

3. The computer-implemented method of claim 2, further comprising storing, with the compressed embedding matrix, auxiliary information representing the reordering of the portions of the embedding matrix, the auxiliary information for use in later restoration of an original ordering of the portions of the embedding matrix.

4. The computer-implemented method of claim 3, wherein the auxiliary information comprises at least one of permutation information, offset information, or an index table.

5. The computer-implemented method of claim 1, wherein applying the decorrelating transform comprises applying a wavelet transform.

6. The computer-implemented method of claim 1, wherein compressing the transformed embedding matrix comprises quantizing values of the transformed embedding matrix to a fixed-point representation.

7. The computer-implemented method of claim 6, wherein compressing the transformed embedding matrix further comprises entropy encoding the fixed-point representation.

8. The computer-implemented method of claim 1, further comprising:

identifying a high-dynamic-range region and a low-dynamic-range region of the transformed embedding matrix; and compressing the high-dynamic-range region and the low-dynamic-range region using different compression settings.

9. The computer-implemented method of claim 1, further comprising generating a decompressed embedding matrix by decoding the compressed embedding matrix and applying an inverse decorrelating transform to reconstruct the embedding matrix.

10. The computer-implemented method of claim 1, further comprising:

selecting a target compression ratio for the embedding matrix based on one or more characteristics of the text content item;

adjusting one or more parameters of the compression operation based on the target compression ratio; and generating the compressed embedding matrix with a non-integer average number of bits per vector component.

11. A system comprising:

at least one processor; and a non-transitory computer readable medium comprising instructions that, when executed by the at least one processor, cause the system to:

generate an embedding matrix comprising a plurality of embedding vectors representing a text content item, the embedding matrix having values arranged along a first dimension expected to exhibit locality among the plurality of embedding vectors;

apply a decorrelating transform along the first dimension of the embedding matrix to generate a transformed embedding matrix, the decorrelating transform applied to compact energy distributed across the embedding matrix in the first dimension into a sub-portion of the transformed embedding matrix;

compress the transformed embedding matrix by performing a compression operation to generate a compressed embedding matrix; and store the compressed embedding matrix for the text content item.

12. The system of claim 11, further comprising instructions that, when executed by the at least one processor, cause the system to store the compressed embedding matrix in non-volatile storage.

13. The system of claim 11, further comprising instructions that, when executed by the at least one processor, cause the system to update a search index of an information retrieval system using the compressed embedding matrix, the search index enabling identification of one or more candidate text content items responsive to a search query.

14. The system of claim 13, further comprising instructions that, when executed by the at least one processor, cause the system to reuse a previously stored compressed embedding matrix during index maintenance for the text content item without regenerating the embedding matrix from the text content item.

15. The system of claim 11, further comprising instructions that, when executed by the at least one processor, cause the system to:

reorder portions of the embedding matrix based on aggregate values of the embedding matrix, the reordering performed before or after applying the decorrelating transform along the first dimension;

apply a second decorrelating transform along a second dimension of the embedding matrix, after the reordering, to generate the transformed embedding matrix; and compress the transformed embedding matrix by performing the compression operation to generate the compressed embedding matrix.

16. A non-transitory computer-readable medium comprising instructions that, when executed by at least one processor, cause the at least one processor to:

generate an embedding matrix comprising a plurality of embedding vectors representing a text content item;

select a first dimension of the embedding matrix for application of a decorrelating transform based on an expected locality among values of the embedding matrix along the first dimension;

apply the decorrelating transform along the first dimension of the embedding matrix to generate a transformed embedding matrix by compacting energy distributed across the embedding matrix in the first dimension into a sub-portion of the transformed embedding matrix; and compress the transformed embedding matrix by performing a compression operation to generate a compressed embedding matrix.

17. The non-transitory computer-readable medium of claim 16, further comprising instructions that, when executed by the at least one processor, cause the at least one processor to store the compressed embedding matrix in non-volatile storage for use in updating a search index of an information retrieval system.

18. The non-transitory computer-readable medium of claim 16, wherein selecting the first dimension comprises selecting a dimension that orders the plurality of embedding vectors according to an ordering of tokens or token groups of the text content item.

19. The non-transitory computer-readable medium of claim 16, wherein selecting the first dimension based on the expected locality comprises selecting the first dimension based on the embedding matrix being generated using an embedding process that encodes the text content item using overlapping segments or sliding windows.

20. The non-transitory computer-readable medium of claim 16, further comprising instructions that, when executed by the at least one processor, cause the at least one processor to:

select a target bit budget or a target compression ratio for the embedding matrix based on one or more characteristics of the text content item; and adjust at least one of a quantization parameter, an entropy-coding parameter, or a coefficient-selection parameter for the compression operation based on the target bit budget or the target compression ratio.

* * * * *